US009182445B2

(12) United States Patent
Wong et al.

(10) Patent No.: US 9,182,445 B2
(45) Date of Patent: Nov. 10, 2015

(54) INTEGRATED CIRCUIT WITH TOGGLE SUPPRESSION LOGIC

(71) Applicant: Broadcom Corporation, Irvine, CA (US)

(72) Inventors: Yuqian C. Wong, La Jolla, CA (US); Yu Zhang, San Diego, CA (US)

(73) Assignee: BROADCOM CORPORATION, Irvine, CA (US)

( * ) Notice: Subject to any disclaimer, the term of this patent is extended or adjusted under 35 U.S.C. 154(b) by 285 days.

(21) Appl. No.: 13/913,344

(22) Filed: Jun. 7, 2013

(65) Prior Publication Data

US 2014/0331099 A1 Nov. 6, 2014

Related U.S. Application Data

(60) Provisional application No. 61/820,094, filed on May 6, 2013.

(51) Int. Cl.
*G01R 31/28* (2006.01)
*G01R 31/3185* (2006.01)

(52) U.S. Cl.
CPC *G01R 31/318547* (2013.01); *G01R 31/318544* (2013.01)

(58) Field of Classification Search
CPC .............. G01R 31/318547; G01R 31/318544
See application file for complete search history.

(56) References Cited

U.S. PATENT DOCUMENTS

| | | | | |
|---|---|---|---|---|
| 6,442,722 B1* | 8/2002 | Nadeau-Dostie et al. | .... | 714/731 |
| 6,487,688 B1* | 11/2002 | Nadeau-Dostie | ............ | 714/726 |
| 6,510,534 B1* | 1/2003 | Nadeau-Dostie et al. | .... | 714/724 |
| 6,519,724 B1* | 2/2003 | Arnould | ........................ | 714/712 |
| 6,654,920 B1* | 11/2003 | Hetherington et al. | ........ | 714/733 |
| 7,457,998 B1* | 11/2008 | Bhatia et al. | .................. | 714/726 |
| 7,526,696 B2* | 4/2009 | Xiang et al. | ................... | 714/726 |
| 7,656,237 B2* | 2/2010 | Riley et al. | ...................... | 331/25 |
| 7,925,465 B2* | 4/2011 | Lin et al. | ........................ | 702/124 |
| 7,934,134 B2* | 4/2011 | Forlenza et al. | .............. | 714/733 |

* cited by examiner

*Primary Examiner* — Esaw Abraham
(74) *Attorney, Agent, or Firm* — McDermott Will & Emery LLP

(57) ABSTRACT

An integrated circuit with toggle suppression logic for built-in self-test is provided. The integrated includes a loading circuit configured to operate in a shift mode based on a first enable signal and a capture mode based on a second enable signal. The integrated circuit includes a switching element configured to receive the first enable signal and the second enable signal to generate a third enable signal. The integrated circuit includes combinational logic coupled to the loading circuit and the switching element, in which the combinational logic is configured to receive the third enable signal. The third enable signal is configured to disable toggling in the combinational logic while the loading circuit operates in the shift mode.

15 Claims, 6 Drawing Sheets

INTEGRATED CIRCUIT WITH TOGGLE SUPPRESSION LOGIC

CROSS-REFERENCE TO RELATED APPLICATIONS

The present application claims the benefit of U.S. Provisional Patent Application Ser. No. 61/820,094, titled "INTEGRATED CIRCUIT WITH TOGGLE SUPPRESSION LOGIC," filed on May 6, 2013, which is hereby incorporated by reference in its entirety for all purposes.

BACKGROUND

Integrated circuits include design-for-test (DFT) techniques such as logic built-in self-test (or logic BIST) to generate test patterns and detect any potential faults in the integrated circuit. The logic BIST, for example, may include a loading circuit for loading a shift pattern via multiple sequential elements. The logic BIST may include a test module to run multiple tests on the integrated circuit. During the loading of the shift pattern, the shift pattern traverses combinational logic between the sequential elements. As such, the shift operation consumes significant power since the combinational logic toggles data that is sent to the sequential elements. In addition, the combinational logic will require time to settle before the loading circuit may pass the fully loaded shift pattern to subsequent elements of the loading circuit.

SUMMARY

A system and/or circuit is provided for an integrated circuit with toggle suppression logic for built-in self-test, substantially as illustrated by and/or described in connection with at least one of the figures, as set forth more completely in the claims.

BRIEF DESCRIPTION OF THE DRAWINGS

Certain features of the subject disclosure are set forth in the appended claims. However, for purpose of explanation, several implementations of the subject disclosure are set forth in the following figures.

DETAILED DESCRIPTION

It is understood that other configurations of the subject disclosure will become readily apparent to those skilled in the art from the following detailed description, wherein various configurations of the subject disclosure are shown and described by way of illustration. As will be realized, the subject disclosure is capable of other and different configurations and its several details are capable of modification in various other respects, all without departing from the scope of the subject disclosure. Accordingly, the drawings and detailed description are to be regarded as illustrative in nature and not as restrictive.

Figure 1:
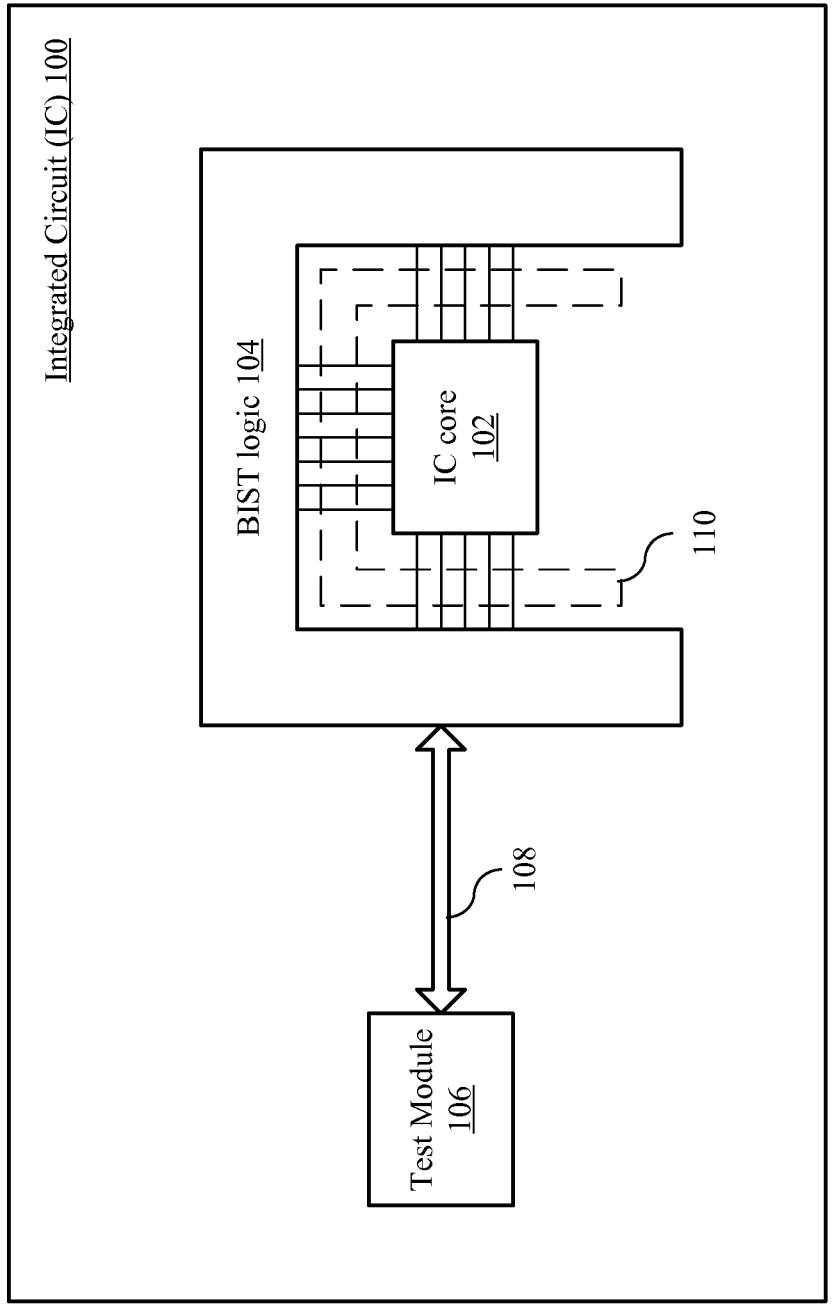
FIG. 1 is a block diagram illustrating an example of an integrated circuit with built-in self-test (BIST) logic in accordance with one or more implementations.

FIG. 1 is a block diagram illustrating an example of integrated circuit 100 with built-in self-test (BIST) logic in accordance with one or more implementations. Integrated circuit (IC) 100 includes IC core 102, BIST logic 104, and test module 106. Test module 106 may be in signal communication with BIST logic 104 via signal path 108, which may be a test bus. IC core 102 may be in signal communication with BIST logic 104 via signal paths 110. IC core 102 may be a die (e.g., IC circuitry) designed into integrated circuit 100 and may include combinational logic (not shown) that is capable of receiving a capture test pattern from test module 106 during a capture mode. Examples of the IC circuitry may include a processor, a controller, an application specific integrated circuit ("ASIC"), a digital signal processor, a memory module, a radio frequency chip-set, a system-on-chip (SOC), or other types of devices. BIST logic 104 may include a loading circuit (not shown) for loading a shift test pattern from test module 106 during a shift mode. Integrated circuit 100 is tested for logical faults during a test mode, that is comprised of the shift mode and the capture mode.

In some aspects, test module 106 may be logic circuitry that is programmable for running test patterns on IC core 102 to detect any potential faults of IC core 102. As such, BIST logic 104 may operate according to some predetermined algorithm, controlled by test module 106, to verify the functionality of IC core 102.

During the test mode of integrated circuit 100, the shift mode takes about 95% of the total test mode. Power consumption in the test mode becomes a significant concern in DFT techniques. Since the toggle rates of the combinational logic during the shift mode are significantly higher than the toggle rates during the non-test mode of integrated circuit 100, the majority of the power consumption can be traced to the combinational logic in the test mode. Higher toggle rates during the test mode can cause a relatively large IR drop, which may further cause testing failures. In addition, electromigration in integrated circuit 100 can be worsened by the higher toggle rates. Some DFT approaches have included reducing the shift frequency of the shift mode or testing different IC core blocks in serial to address the effects of the higher toggle rates. Although the DFT approaches attempt to address the IR drop and electromigration, reducing the shift frequency or testing in serial both increase the test time of integrated circuit 100.

As used herein, the term toggle rate, for sequential elements, may sometimes refer to how often an output changes relative to a given clock input. In some aspects, the toggle rate may be modeled as a percentage (e.g., between 0% to 100%). The toggle rate may be computed based on whether the sequential element toggles on a rising edge (e.g., low to high transition) or a falling edge (e.g., high to low transition) of the clock input. The toggle rate of the sequential element may be adjusted according to the rate of an enable input.

As will be discussed in further detail, the subject disclosure provides toggle suppression logic to suppress toggle rates during the test mode of integrated circuit 100 that have a significant impact on the power consumption of integrated circuit 100.

Figure 2:
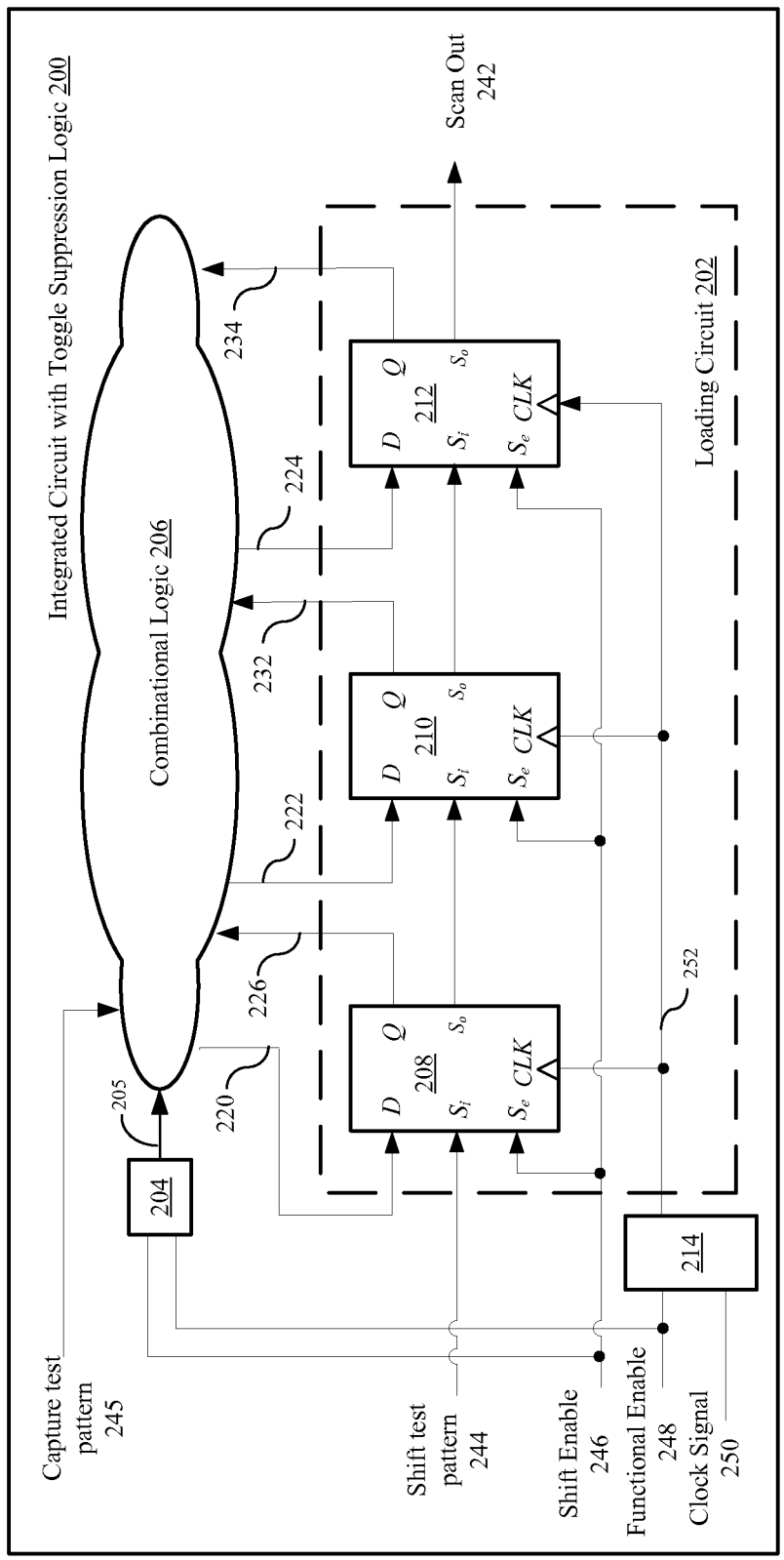
FIG. 2 is a schematic diagram illustrating an example of toggle suppression logic in the integrated circuit of FIG. 1 in accordance with one or more implementations.

FIG. 2 is a schematic diagram illustrating an example of an integrated circuit 200 with toggle suppression logic in accordance with one or more implementations. Integrated circuit 200 includes loading circuit 202, switching element 204 and combinational logic 206. In some aspects, combinational logic 206 may be part of IC core 102 (FIG. 1). In some aspects, loading circuit 202 may be part of BIST logic 104 (FIG. 1). Loading circuit 202 may include a shift register that is composed of multiple sequential elements to load and shift a shift test pattern 244 during a shift mode, and then through combinational logic 206 during a capture mode.

For simplicity, only three sequential elements 208, 210, and 212 are shown but loading circuit 202 may include more (or less) sequential elements than shown in FIG. 2, where the number of sequential elements is determined by the design of combinational logic 206 and testing algorithms.

In some aspects, sequential elements 208, 210, and 212 of loading circuit 202 may be implemented as D-latch flip-flops having data ("D"), scan-in ("$S_i$"), scan-out ("$S_o$") and scan-enable ("$S_e$") inputs, sequential output ("Q"), and a clock input ("CLK"). The clock input is driven by gated clock signal 252. In some aspects, clock gating element 214 receives functional enable signal 248 and clock signal 250 to generate gated clock signal 252. In this respect, clock gating element 214 controls the waveform of clock signal 250 to the clock input of sequential elements 208, 210, and 212. In one or more implementations, gated clock signal 252 determines when loading circuit 202 enters the capture mode. As will be discussed in further detail, the capture mode allows sequential elements 208, 210 and 212 to monitor any logical faults via combinational logic 206. In some aspects, functional enable signal 248 is configured to activate sequential elements 208, 210 and 212 in a non-testing mode. In this respect, data transitions through the data input and sequential output of each sequential element at each clock transition.

In one or more implementations, a test input, a test enable input and a test path may be sometimes referred to as a scan input, a scan enable input, a scan path, respectively. In some implementations, the scan enable input may be sometimes referred to as a shift enable input.

In one or more aspects, a sequential element (e.g., sequential elements 208, 210, 212) is a digital element whose output depends on previous as well as current inputs. In other words, the element has memory or retains state. A sequential element can be used to keep data in sequence as it moves through a digital pipeline or finite state machine. Examples of sequential elements include positive-edge-triggered flip-flops, negative-edge-triggered flip-flops, dual-edge-triggered flip-flops, pulsed latches, two-phase latches, Muller C elements, registers and others. Scannable sequential elements can choose between an ordinary input and a test input based on a test enable signal. The figures in this disclosure illustrate scannable positive-edge triggered flip-flops, but the subject disclosure is also applicable to other scannable sequential elements.

Combinational logic 206 may be in signal communication with first sequential element 208 via signal paths 220 and 226, second sequential element 208 via signal paths 222 and 232, and third sequential element 210 via signal path 224.

Integrated circuit 200 may perform a process that includes loading a shift test pattern 244 into loading circuit 202, applying shift enable signal 246 to loading circuit 202 to shift the shift test pattern 244 through loading circuit 202, and applying shift enable signal 246 to combinational logic 206 to disable toggling in combinational logic 206 while shift test pattern 244 is shifted through loading circuit 202. In one or more implementations, shift test pattern 244 includes a bit stream that is configured to test combinational logic 206 for logical faults. In some aspects, shift enable signal 246 is configured to activate sequential elements 208, 210 and 212 into a testing mode. As such, data transitions through the scan-in input and scan-out output of each sequential element at each clock transition. In this respect, functional enable signal 248 and shift enable signal 246 are both on.

In some aspects, loading circuit 202 is configured to operate in a shift mode based on a first enable signal (sometimes referred to as shift enable signal 246) and a capture mode based on a second enable signal (sometimes referred to as functional enable signal 248). In this respect, integrated circuit 200 may include a multiplexer (not shown) that switches the data path between shift mode and capture mode. In some aspects, the multiplexer is coupled to the data input and scan-in input of sequential elements 208, 210 and 212 of loading circuit 202. As such, the multiplexer can switch between the data input and the scan-in input depending on the selected mode.

Loading circuit 202 is configured to shift the shift test pattern 244 through loading circuit 202 based on shift enable signal 246. Shift enable signal 246 is configured to set loading circuit 202 into a shift mode directed to shifting shift test pattern 244 through sequential elements 208, 210 and 212 via the scan-in ("$S_i$") and scan-out ("$S_o$") ports. In this respect, loading circuit 202 is configured to shift the shift test pattern 244 in the shift mode if shift enable signal 246 is on and functional enable signal 248 is off.

As stated above, the power consumption by combinational logic 206 during the shift mode has a significant impact on the overall power consumption of integrated circuit 100. As such, combinational logic 206 is disabled while shift test pattern 244 is shifted through loading circuit 202. Switching element 204 is configured to receive the first enable signal (e.g., shift enable signal 246) and the second enable signal (e.g., functional enable signal 248) to generate a third enable signal (sometimes referred to as toggle enable signal 205). Combinational logic 206 is coupled to loading circuit 202 and switching element 204. Combinational logic 206 is configured to receive the third enable signal (e.g., toggle enable signal 205). In this respect, switching element 204 disables any toggling in combinational logic 206 while loading circuit 202 operates in the shift mode (e.g., when toggle enable signal is off). In some aspects, switching element 204 may include transistors, logic gates and/or combinational gate switches.

In some aspects, the toggling in combinational logic 206 is disabled in the shift mode when toggle enable signal 205 is off. Toggle enable signal 205 may be off if shift enable signal 246 is off and functional enable signal 248 is off. Toggle enable signal 205 may be off if shift enable signal 246 is on and functional enable signal 248 is off. Toggle enable signal 205 may be off if shift enable signal 246 is on and functional enable signal 248 is on.

As used herein, the terms "on" and "off" may refer to the voltage level of a signal. Depending on implementation, a logical gate may be active high to denote that the input of the logical gate requires a logical high (or "1") to become activated. Alternatively, if active low, the input of the logical gate requires a logical low (or "0") to become activated. In this respect, the term "on" may sometimes refer to a logical high voltage and the term "off" may sometimes refer to a logical low voltage.

Once shift test pattern 244 is fully loaded into loading circuit 202 and shift enable signal 246 turns off (or becomes inactive), the sequential outputs Q of sequential elements 208, 210 and 212 pass to combinational logic 206 via signal paths 226, 232 and 234, respectively. In some aspects, combinational logic 206 is configured to toggle in the capture mode. As such, combinational logic 206 outputs a result test pattern via signal paths 222 and 224 during the capture mode. Loading circuit 202 is configured to receive the result test pattern (not shown) based on shift test pattern 244 and capture test pattern 245 in the capture mode if functional enable signal 248 is on and shift enable signal 246 is off. Loading circuit 202 is configured to receive the result test pattern via the data input ("D") and configured to receive shift test pattern 244 via the scan-in input ("$S_i$"). In some aspects, the result test pattern is a combination of capture test pattern 245 that is fed to combinational logic 206 and shift test pattern 244 during the capture mode.

Moreover, the figures in this disclosure illustrate implementations using complementary metal-oxide semiconductor (CMOS) transistors, but the subject disclosure is also applicable to any other device capable of implementing digital logic including, but not limited to, bipolar transistors, tunnel transistors, gallium arsenide transistors, micro-electro-mechanical relays, Josephson junctions, and discrete components.

Figure 3:
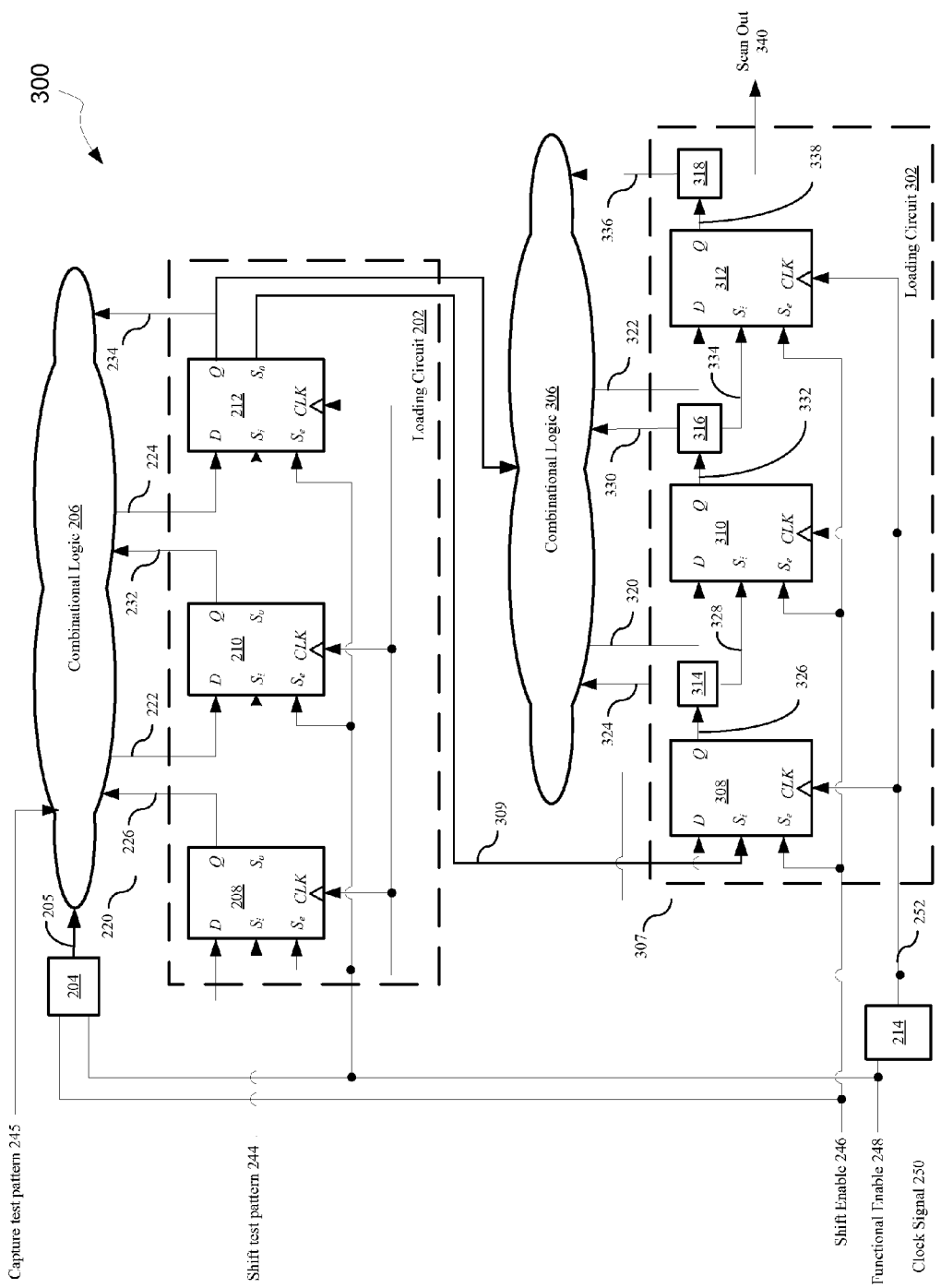
FIG. 3 is a schematic diagram illustrating an example of an integrated circuit with toggle and output suppression logic in accordance with one or more implementations.

FIG. 3 is a schematic diagram illustrating an example of an integrated circuit 300 with toggle and output suppression logic in accordance with one or more implementations. Like integrated circuit 200, integrated circuit 300 includes built-in self-test for testing logical faults. Here, two register paths are provided with separate suppression logic mechanisms. Integrated circuit 300 includes loading circuit 202 that is composed of registers 208, 210 and 212 on a first register path and loading circuit 302 that is composed of registers 308, 310 and 312 on a second register path. In this respect, registers 308, 310 and 312 are located downstream from registers 208, 210 and 212. In some aspects, loading circuit 202 and loading circuit 302 may be integrated into a common loading circuit.

As shown in FIG. 3, registers 208, 210, 212, 308, 310 and 312 respectively include data ("D"), scan-in ("$S_i$"), scan-out ("$S_o$") and scan-enable ("$S_e$") inputs, a sequential output ("Q"), and a clock input ("CLK"). The clock input Q may be configured to receive gated clock signal 252 via clock gating element 214. In some aspects, the clock input Q may be configured to receive functional enable signal 248 without passing through a logical gate or transistor. The scan-in input $S_i$ is configured to receive shift test pattern 244 from a preceding one of registers 208, 210, 212, 308, 310 and 312. Conversely, the scan-out output So is configured to provide shift test pattern 244 to a subsequent one of registers 208, 210, 212, 308, 310 and 312. In this respect, register 210 may be configured to receive shift test pattern 244 from the scan-out output of register 208. Scan enable input $S_e$ is configured to receive shift enable signal 246.

Loading circuits 202 and 302 are respectively configurable as shift registers in a shift mode and configurable as capture registers in a capture mode. Integrated circuit 300 further includes combinational logic 206 on the first register path and combinational logic 306 on the second register path. Regarding the suppression logic mechanisms, integrated circuit 300 includes switching element 204 with respect to the first register path to suppress toggling in combinational logic 206 and switching elements 314, 316 and 318 to suppress the outputs of registers 308, 310 and 312.

As shown in FIG. 3, registers 208, 210, 212, 308, 310 and 312 are connected in a daisy-chain in their respective paths. The first register path may be daisy chained to the second register path via scan chain signal 309. In shift mode, registers 208, 210 and 212 are configured to receive and shift a shift test pattern 244 based on a first enable signal (e.g., shift enable signal 246). Similarly, registers 308, 310 and 312 are configured to receive and shift the shift test pattern 244 based on shift enable signal 246. In this respect, shift test pattern 244 passes through the scan-in ("$S_i$") and scan-out ("$S_o$") ports of registers 208, 210, 212, 308, 310 and 312. In some aspects, registers 208, 210, 212, 308, 310 and 312 are configured to operate in the shift mode when shift enable signal 246 is on and functional enable signal is off. In one or more implementations, registers 208, 210, 212 may be configured as a first shift register on its respective register path and registers 308, 310 and 312 may be configured as a second shift register on its respective register path.

Integrated circuit 300 also includes switching element 204 that is configured to receive shift enable signal 246 and functional enable signal 248 to generate a third enable signal (e.g., toggle enable signal 205). Combinational logic 206 is coupled to switching element 204 and is located between registers 208 and 212. Combinational logic 206 is configured to receive toggle enable signal 205. Toggle enable signal 205 is configured to disable toggling in combinational logic 206 while shift test pattern 244 is shifted through registers 208, 210, 212.

In capture mode, the data ("D") and output ("Q") ports are enabled, and the scan-in ("$S_i$") and scan-out ("$S_o$") ports are disabled. As such, registers 208, 210, 212, 308, 310 and 312 are configured to receive a result test pattern from combinational logic 206, via signal paths 220, 222 and 224 based on a second enable signal (e.g., functional enable 248). In this respect, the result test pattern passes through the data ("D") inputs.

In some aspects, registers 208, 210, 212, 308, 310 and 312 are configured to operate in the capture mode when functional enable signal 248 is on and shift enable signal 246 is off. In this respect, toggle enable signal 205 is off if shift enable signal 246 is on, or in the alternative, toggle enable signal 205 is on if shift enable signal 246 is off and functional enable signal 248 is on.

In one or more implementations, toggle enable signal 205 is configured to enable toggling in combinational logic 206 when shift test pattern 244 is loaded into registers 208, 210, 212. In this respect, the toggling is enabled when toggle enable signal 205 is on (or logical high depending on implementation). Alternatively, the toggling in combinational logic 206 is disabled when toggle enable signal 205 is off (or logical low depending on implementation).

Combinational logic 206 is configured to receive shift test pattern 244 from registers 208, 210, 212 in the shift mode (or when toggle enable signal 205 is on). Combinational logic 206 is also configured to receive capture test pattern 245 to provide the result test pattern to registers 208, 210, 212 if toggle enable signal is on.

Combinational logic 206 is configured to have a first toggle rate if toggle enable signal 205 is on and a second toggle rate if toggle enable signal 205 is off. In this respect, the first toggle rate is greater than the second toggle rate. This is because the toggling in combinational logic 206 is disabled (or inactive) when toggle enable signal is off. In some aspects, the first toggle rate may be reduced significantly if toggle enable signal is off such that the first toggle rate is negligible compared to the second toggle rate.

In one or more implementations, integrated circuit 200 includes a respective second switching element (e.g., switching elements 314, 316 and 318) that is coupled to combinational logic 306 and an output of each of registers 308, 310 and 312. In some aspects, switching elements 314, 316 and 318 may be configured to receive toggle enable signal 205 such that the outputs may be disabled during the shift mode. Switching elements 314, 316 and 318 may be configured to selectively pass an output signal from a respective one of registers 308, 310 and 312 without passing the output signal to combinational logic 306 based on toggle enable signal 205.

Combinational logic 306 may be in signal communication with sequential first element 308 via signal paths 307, 324 and 326, second sequential element 310 via signal paths 320, 330 and 332, and third sequential element 312 via signal paths 336 and 338. Once shift test pattern 244 is fully loaded into loading circuit 302 and shift enable signal 246 turns off (or becomes inactive), the sequential outputs Q of sequential elements 308, 310 and 312 pass to combinational logic 306 via signal paths 324, 330 and 336, respectively. In some aspects, scan out 340 provides shift test pattern 244 to a subsequent scan chain (not shown). In one or more aspects, scan out 340 provides the result test pattern to an output of integrated circuit 300.

Figure 4:
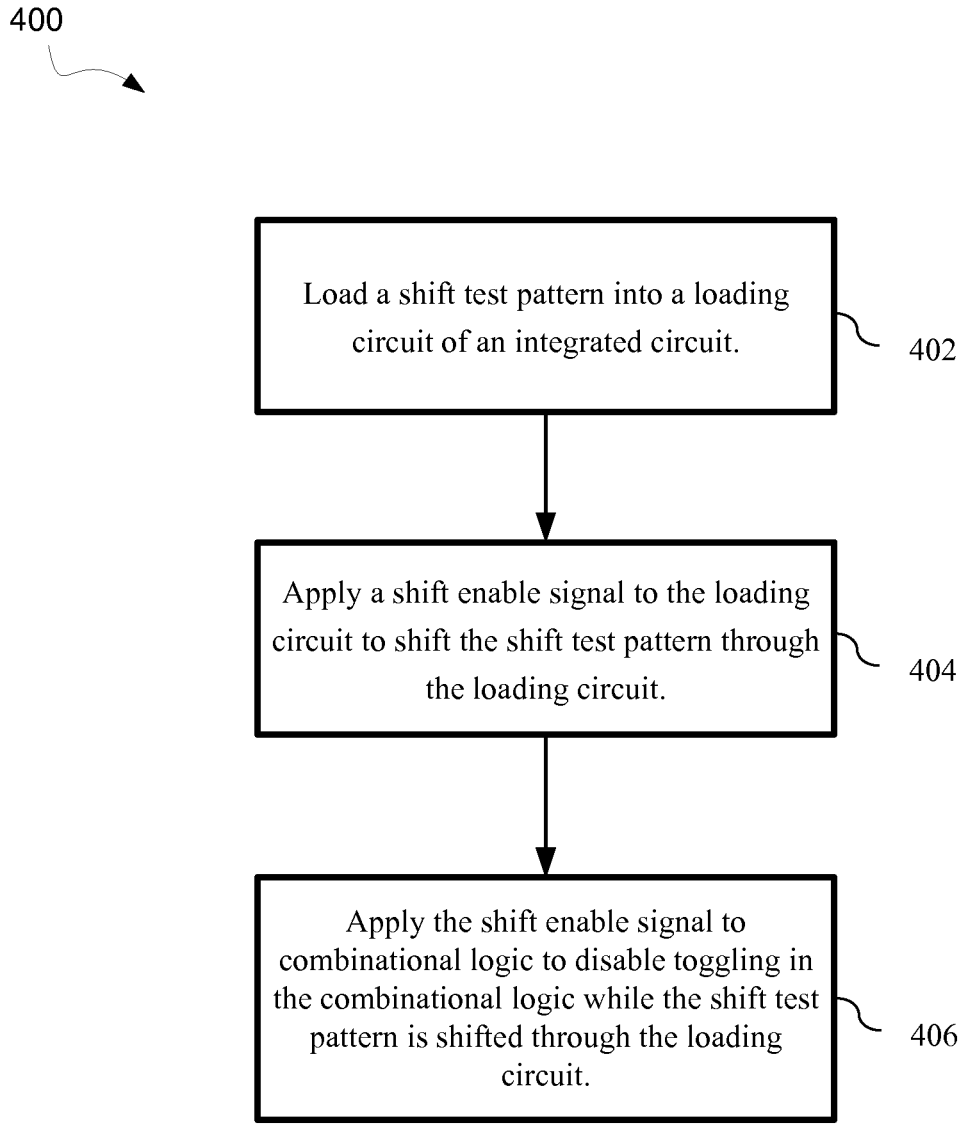
FIG. 4 is a schematic diagram illustrating an example of a method to provide toggle suppression logic with one or more implementations.

FIG. 4 is a schematic diagram illustrating an example of a method 400 to provide toggle suppression logic with one or more implementations. Method 400 includes loading a shift test pattern into a loading circuit of an integrated circuit (402). Method 400 also includes applying a shift enable signal to the loading circuit to shift the shift test pattern through the loading circuit (404). In applying the shift enable signal to the combinational logic, method 400 may include applying a functional enable signal combined with the shift enable signal. Method 400 also includes applying the shift enable signal to combinational logic to disable toggling in the combinational logic while the shift test pattern is shifted through the loading circuit (406).

Method 400 may include removing the shift enable signal from the combinational logic when the shift test pattern is loaded into the loading circuit. Method 400 also may include loading a capture test pattern into the combinational logic if the shift enable signal is not applied. In turn, method 400 may include passing the shift test pattern from the loading circuit to the combinational logic to combine with the capture test pattern. Further, method 400 may include capturing a result test pattern from the combinational logic based on shift test pattern and the capture test pattern.

Figure 5:
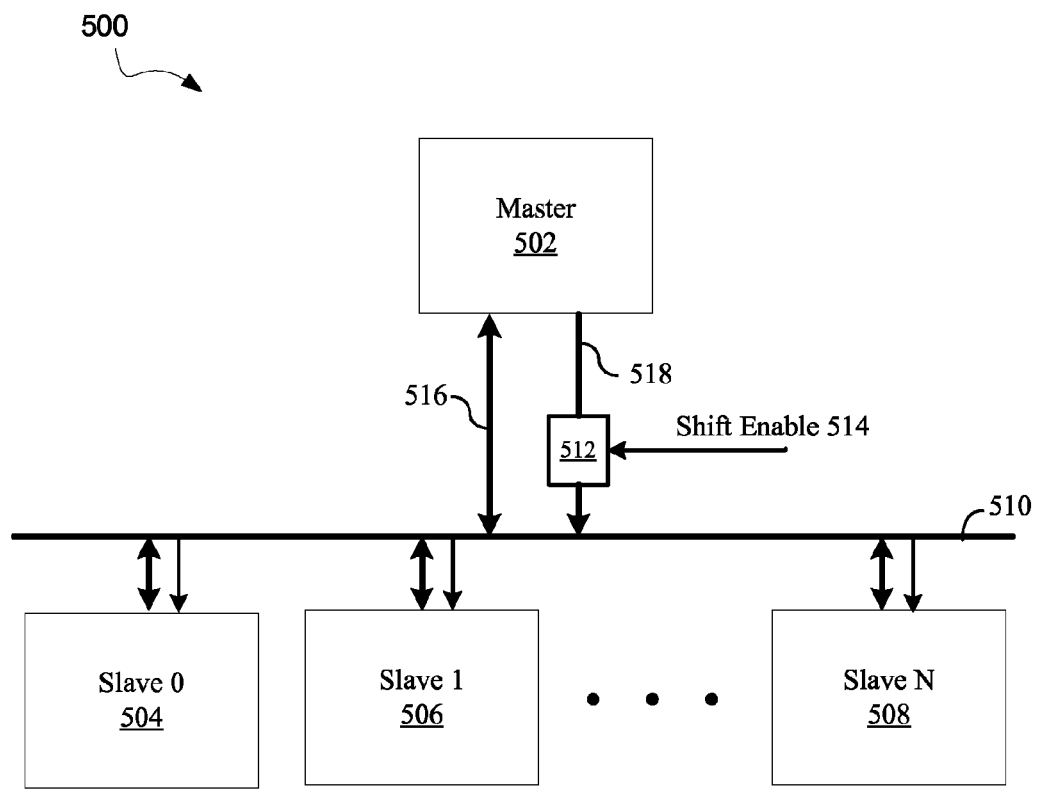
FIG. 5 is a diagram illustrating an example of a master/slave memory architecture with toggle suppression logic in accordance with one or more implementations.

FIG. 5 is a diagram illustrating an example of bus architecture 500 with toggle suppression logic in accordance with one or more implementations. Bus architecture 500 includes master module 502, slave modules 504, 506 and 508, bus 510, switching element 512, shift enable signal 514, data interface 516 and control interface 518. As shown in FIG. 5, the number of slave modules can be more or less, where N is a positive integer number.

Master module 502 may be configured to select one or more of slave modules 504, 506 and 508. Master module 502 may select the slave module using an address and/or chip select signal. Control interface 518 may be configured to include the address and/or chip select signal. As such, control interface 518 may be configured to disable selection of slave modules during a test phase (or shift mode of the test phase) of bus architecture 500. In this respect, switching element 512 may be coupled to control interface 518 to provide signaling that disables selection of slave modules 504, 506 and 508. Shift enable signal 514 may be configured to drive switching element such that the chip select signal in combination with shift enable signal 514 are used to disable the slave module selection. In one or more aspects, if shift enable signal 514 is off, selection of slave modules 504, 506 and 508 is disabled. Alternatively, if shift enable signal 514 is on, selection is enabled.

Figure 6:
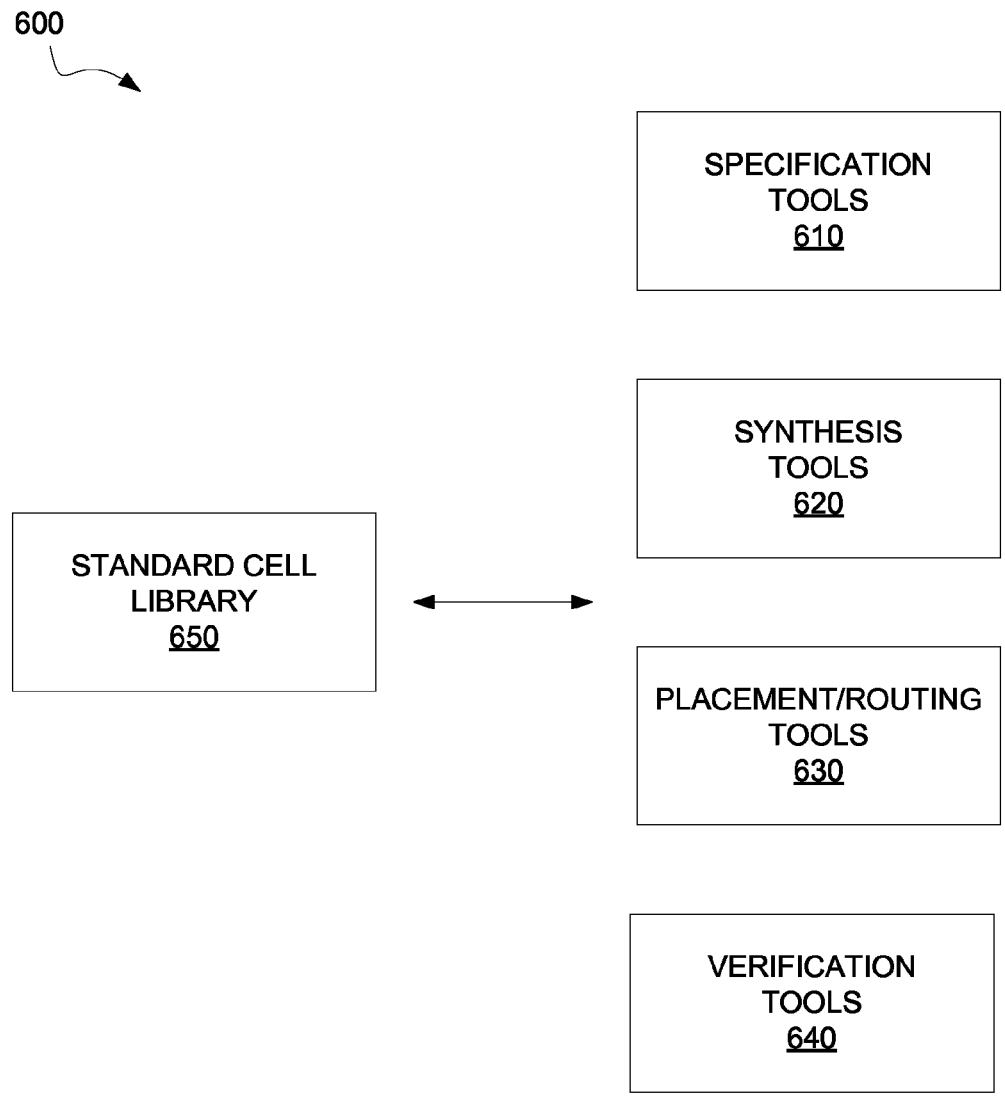
FIG. 6 is a diagram illustrating a design environment used in the design of integrated circuits in accordance with one or more implementations.

FIG. 6 is a diagram illustrating a design environment 600 used in the design of integrated circuits in accordance with one or more implementations. The design environment 600 includes specification tools 610, synthesis tools 620, placement/routing tools 630, and verification tools 640. During the design process, the functionality of the chip is specified in a specification tool 610 using a standard hardware programming language such as Verilog or Very-high-speed integrated circuits Hardware Description Language (VHDL). The resulting circuit description is synthesized/mapped into the basic gates of a standard cell library 650, using one or more synthesis tools 620. The resulting gate netlist is then placed and routed using placement/routing tools 630. Finally, the connectivity and functionality of the integrated circuit are verified using a verification tool 640.

The standard cell library 650 may include hundreds of standard cells, such as logic gates (e.g. AND, OR, NAND, NOR, XOR, NOT) and sequential elements. The library typically has multiple standard cells with the same logical function but different sizes, timing characteristics, and/or physical designs.

During the synthesis stage of designing an integrated circuit, synthesis tools 620 may be implemented with a method of determining toggle suppression logic during a test phase of the integrated circuit. The method may include receiving the gate netlist comprising instantiations of design-for-test elements. In some aspects, the method may include analyzing a synthesis report output from synthesis tools 620. The method may include identifying candidate combinational logic networks provided in the gate netlist. The method may include calculating toggle rates of each of the candidate combinational logic networks in a shift mode of the test phase. The method may include selecting one or more of the candidate combinational logic networks having a toggle rate that is greater than a threshold. The method may include evaluating the gate netlist with the toggle rate disabled for the selected combinational logic networks. The method may include determining a number of timing paths disabled by a functional enable signal feeding into combinational logic of the integrated circuit. The method may include generating a revised gate netlist that inserts one or more switching elements that are configured to disable toggling in the selected combinational logic networks in the shift mode. In this respect, the switching elements can be implemented if the number of disabled timing paths exceeds a threshold. For IP-based integrated circuits (e.g., the master/slave bus architecture 500 of FIG. 5), the switching elements can be implemented in the resulting circuit description (e.g., register-transfer level (RTL) netlist) output from specification tools 610.

The terms "input" and "output" as used herein may refer to a non-transitory signal or a physical item such as a node, a circuit, a block, a pad, a terminal, a port, a raised semiconductor structure, and other similar physical items.

One or more implementations are performed by one or more integrated circuits, such as application specific integrated circuits (ASICs) or field programmable gate arrays (FPGAs). In one or more implementations, such integrated circuits execute instructions that are stored on the circuit itself. The term "integrated circuit" or "semiconductor device" may include, but is not limited to, a design tool output file as binary code encompassing the overall physical design of the integrated circuit or semiconductor device, a data file encoded with code representing the overall physical design of the integrated circuit or semiconductor device, a packaged integrated circuit or semiconductor device, or an unpackaged die. The data file can include elements of the integrated circuit or semiconductor device, interconnections of those elements, and timing characteristics of those elements (including parasitics of the elements).

As used herein, the terms, chip, chip-set, die, integrated circuit, semiconductor device, and microelectronic device, are applicable to the subject technology as these terms can be used interchangeably in the field of electronics. With respect to a chip, power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips can be made by way of electrical conductors, chips and other circuit elements may alternatively be coupled by way of, but not limited to, optical, mechanical, magnetic, electrostatic, and electromagnetic interfaces.

The terms metal line, trace, wire, interconnect, conductor, signal path and signaling medium can be all related. The related terms listed above, can be interchangeable, and appear in order from specific to general. In the field of electronics, metal lines are sometimes referred to as traces, wires, lines, interconnect or simply metal. Metal lines, such as, but not limited to, aluminum (Al), copper (Cu), an alloy of Al and Cu, an alloy of Al, Cu and silicon (Si), tungsten (W), nickel (Ni), titanium nitride (TiN), and tantalum nitride (TaN) are conductors that provide signal paths for interconnecting electrical circuitry. Other conductors, both metal and non-metal are available in microelectronic devices. Materials such as doped polysilicon, doped single-crystal silicon (often referred to simply as diffusion, regardless of whether such doping is achieved by thermal diffusion or ion implantation), titanium (Ti), cobalt (Co), molybdenum (Mo), and refractory metal silicides are examples of other conductors.

In the semiconductor industry environment of foundries and fabless companies, it is the foundries that develop, specify and provide the physical structures that designers use to implement their designs. Foundries provide manufacturing services to many fabless semiconductor companies, but to operate profitably, they must optimize their manufacturing processes to achieve high yields. Such optimizations typically require that limitations be placed on the variety of structures that can be produced by a particular manufacturing process. Consistent with the foregoing, foundries typically provide a limited set of transistor structures that are intended to cover a broad range of circuit implementations.

The various illustrative blocks, elements, components, and methods described herein may be implemented as electronic hardware. Various illustrative blocks, elements, components, and methods have been described above generally in terms of their functionality. Whether such functionality is implemented as hardware depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

The predicate words "configured to" and "operable to" do not imply any particular tangible or intangible modification of a subject, but, rather, are intended to be used interchangeably. In one or more implementations, a receiver configured to receive and process an operation or a component may also mean the receiver being operable to receive and process the operation.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. Such disclosure may provide one or more examples. A phrase such as an aspect may refer to one or more aspects and vice versa, and this applies similarly to other phrases.

Any implementation described herein as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An integrated circuit with built-in self-test, comprising:
 a loading circuit configured to operate in a shift mode based on a first enable signal and a capture mode based on a second enable signal,
 a switching element configured to receive the first enable signal and the second enable signal to generate a third enable signal; and
 combinational logic coupled to the loading circuit and the switching element, the combinational logic configured to receive the third enable signal,
 wherein the switching element is configured to:
  provide the third enable signal to disable toggling in the combinational logic while the loading circuit operates in the shift mode, wherein the third enable signal is set to on when the first enable signal is set to on and the second enable signal is set to off, otherwise the third enable signal is set to off, and
  disable the toggling in the combinational logic when the third enable signal is set to off.

2. The integrated circuit of claim 1, wherein the combinational logic is configured to toggle in the capture mode.

3. The integrated circuit of claim 1, wherein the loading circuit is configured to shift a shift test pattern in the shift mode if the first enable signal is on and the second enable signal is off, wherein the loading circuit is configured to receive a result test pattern based on the shift test pattern and a capture test pattern in the capture mode if the second enable signal is on and the first enable signal is off.

4. The integrated circuit of claim 3, wherein the loading circuit comprises a data input and a test input, the loading circuit configured to receive the result test pattern via the data input, the loading circuit configured to receive the shift test pattern via the test input.

5. An integrated circuit with built-in self-test, comprising:
a loading circuit configured to shift a shift test pattern based on a first enable signal and capture a capture test pattern based on a second enable signal;
a switching element configured to receive the first enable signal and the second enable signal to generate a third enable signal; and
combinational logic coupled to the switching element and the loading circuit, the combinational logic configured to receive the third enable signal,
wherein the switching element is configured to:
provide the third enable signal to disable toggling in the combinational logic while the shift test pattern is shifted through the loading circuit, wherein the third enable signal is set to on when the first enable signal is set to on and the second enable signal is set to off, otherwise the third enable signal is set to off, and
disable the toggling in the combinational logic when the third enable signal is set to off,
wherein the combinational logic is configured to receive the shift test pattern from the loading circuit and a capture test pattern to provide a result test pattern if the third enable signal is on.

6. The integrated circuit of claim 5, wherein the loading circuit comprises a plurality of sequential elements, wherein the shift test pattern is shifted through the plurality of sequential elements.

7. The integrated circuit of claim 6, wherein the switching element is configured to enable toggling in the combinational logic if the shift test pattern is loaded into the plurality of sequential elements.

8. The integrated circuit of claim 6, wherein the plurality of sequential elements respectively comprise a clock input, a scan input, a scan output and a scan enable input, wherein the clock input is configured to receive the second enable signal, wherein the scan input is configured to receive the shift test pattern from a preceding one of the plurality of sequential elements, wherein the scan output is configured to provide the shift test pattern to a subsequent one of the plurality of sequential elements, and wherein the scan enable input is configured to receive the first enable signal.

9. The integrated circuit of claim 5, wherein the combinational logic is configured to have a first toggle rate if the third enable signal is on and a second toggle rate if the third enable signal is off, wherein the first toggle rate is greater than the second toggle rate.

10. The integrated circuit of claim 9, wherein the loading circuit is configured to operate in a shift mode when the first enable signal is on and the second enable signal is off, wherein the loading circuit is configured to operate in a capture mode when the second enable signal is on and the first enable signal is off, wherein the third enable signal is off if the first enable signal is on, wherein the third enable signal is on if the first enable signal is off and the second enable signal is on.

11. The integrated circuit of claim 5, comprising:
a first downstream register;
a second downstream register coupled to the first downstream register;
second combinational logic coupled to the first and second downstream registers; and
a second switching element coupled to the second combinational logic and an output of the first downstream register, the second switching element configured to receive the third enable signal, wherein the second switching element is configured to selectively pass an output signal from the first downstream register to the second downstream register without passing the output signal to the second combinational logic.

12. The integrated circuit of claim 5, wherein the switching element comprises a logic gate.

13. A method of providing toggle suppression logic in an integrated circuit, the method comprising:
loading a shift test pattern into a loading circuit of the integrated circuit;
applying a shift enable signal to the loading circuit to shift the shift test pattern through the loading circuit; and
applying a toggle enable signal to combinational logic to disable toggling in the combinational logic while the shift test pattern is shifted through the loading circuit,
wherein applying the toggle enable signal to the combinational logic comprises applying a functional enable signal combined with the shift enable signal,
wherein the toggle enable signal is set to on when the shift enable signal is set to on and the functional enable signal is set to off, otherwise the toggle enable signal is set to off,
wherein the toggling in the combinational logic is disabled when the toggle enable signal is set to off.

14. The method of claim 13, comprising:
removing the shift enable signal from the combinational logic when the shift test pattern is loaded into the loading circuit.

15. The method of claim 13, comprising:
loading a capture test pattern into the combinational logic if the shift enable signal is not applied;
passing the shift test pattern from the loading circuit to the combinational logic to combine with the capture test pattern; and
capturing a result test pattern from the combinational logic based on the shift test pattern and the capture test pattern.

* * * * *